(12) United States Patent
Ishitani et al.

(10) Patent No.: US 7,186,975 B2
(45) Date of Patent: Mar. 6, 2007

(54) SCANNING CHARGED-PARTICLE MICROSCOPE (75) Inventors: Tohru Ishitani, Hitachinaka (JP); Hideo Todokoro, Hinode (JP); Mitsugu Sato, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/943,262

(22) Filed: Aug. 30, 2001

(65) Prior Publication Data

US 2002/0079448 A1 Jun. 27, 2002

(30) Foreign Application Priority Data

Oct. 12, 2000 (JP) .............................. 2000-316843

(51) Int. Cl.
G01N 23/00 (2006.01)
G21K 7/00 (2006.01)
(52) U.S. Cl. ........................ 250/310; 250/311; 250/307
(58) Field of Classification Search ................ 250/310, 250/311, 309, 315.5, 307
See application file for complete search history.

(56) References Cited

U.S. PATENT DOCUMENTS 3,714,422 A * 1/1973 Hosoki et al. ............... 250/307
3,996,468 A 12/1976 Fletcher et al.
4,608,491 A * 8/1986 Kokubo ....................... 250/311
5,866,905 A * 2/1999 Kakibayashi et al. ....... 250/311
5,900,629 A * 5/1999 Todokoro et al. ........... 250/310

FOREIGN PATENT DOCUMENTS

| JP | 48 85069 | 11/1973 |
| JP | 5-94798 | 4/1993 |
| JP | A 5-258700 | 10/1993 |
| JP | A 8-17714 | 1/1996 |
| JP | A 8-138600 | 5/1996 |
| JP | A 11-186150 | 7/1999 |
| JP | 11-297610 | 10/1999 |
| JP | A 11-297610 | 10/1999 |
| JP | 2000-012454 | 1/2000 |
| JP | 2000-299081 | 10/2000 |

OTHER PUBLICATIONS

"Optics for Super Resolution", edited by Satoshi Kawada (Mar. 20, 1999).

* cited by examiner

Primary Examiner—Manish S. Shah
Assistant Examiner—Lam S. Nguyen
(74) Attorney, Agent, or Firm—Kenyon & Kenyon LLP (57) ABSTRACT In orer to supply a scanning charged-particle microscope that can achieve both the improvement of resolution and that of focal depth at the same time, a scanning charged-particle microscope is supplied which is characterized in that a passage aperture for limiting the passage of the charged-particle optical beam is located between the charged-particle source and the scanning deflector, and in that a member for limiting the passage of the charged-particle optical beam is provided at least in the center of the passage aperture.

7 Claims, 7 Drawing Sheets

SCANNING CHARGED-PARTICLE MICROSCOPE

BACKGROUND OF THE INVENTION

The present invention relates to a charged-particle microscope that scans the surface of a sample, more particularly to a scanning charged-particle microscope that enables both focal depth and resolution to be improved at the same time.

The scanning electron microscope (hereinafter referred to as SEM), which is one type of electron microscope, is an observation apparatus that, as disclosed in, for example, Japanese Application Patent Laid-Open Publication No. Hei05-94798, enables the surface shape of a sample to be displayed on an image display unit (for example, a CRT monitor) by focusing through an electromagnetic lens and the like the electron beam emitted from the electron gun inside, then scanning this electron beam in two-dimensional form on the sample, and detecting the secondary charged particles emitted from the sample.

The surface of the sample to be observed using SEM is usually not uniform. For a semiconductor device, for example, humps such as wiring, and recesses such as contact holes, are present in mixed form on the device. To obtain a clear image of such a sample, it is necessary that the diameter, $d_p$, of the electron beam should be equal to or less than image resolution and that such a status should be maintained over the entire observation region. That is to say, the differences in level between the humps and recesses formed in the observation region need to stay within the focal depth, $D_F$, of SEM.

The focal depth, $D_F$, can be approximately represented using the following expression:

$$D_F = dp/\alpha \qquad (1)$$

where $\alpha$ is the half-opening angle of the beam.

For SEM, however, it is different to enlarge the focal depth, especially, during high-magnification observation, because, in the case of SEM, the electron beam needs to be focused into a probe shape for improved spatial resolution and the beam diameter, $d_p$, cannot therefore be increased and because a decrease in the beam half-opening angle, a, may affect diffractive aberration.

Furthermore, lamination in a vertical direction in addition to mounting-density enhancement of two-dimensional circuit elements has come to be demanded towards recent semiconductor devices in order to achieve a higher degree of integration. In the case of SEM, which is intended to observe high-density semiconductor devices, although the beam diameter, $d_p$, needs to be reduced for enhancing the spatial resolution of the electron probe during high-magnification observation, since the focal depth is reduced by the relationship of calculation expression (1), the focus of the beam which has been focused on a contact hole deeply formed by lamination deflects at the bottom of the contact hole, with the result that the image of the sample becomes partly indistinct.

In other words, SEM has a contradictory relationship between the spatial resolution and focal depth of its electron probe, and this contradiction poses the problem that SEM cannot be applied to semiconductor devices particularly high in the degree of integration.

SUMMARY OF THE INVENTION

It is the object of the present invention to solve the above-mentioned problem and provide a scanning charged-particle microscope capable of achieving both the improvement of resolution and that of focal depth at the same time.

In order to fulfill the object described above, the present invention provides a scanning charged-particle microscope having a charged-particle source, a lens for focusing the charged-particle optical beam emitted from said charged-particle source, and a scanning deflector for scanning said charged-particle optical beam in two-dimensional form on a sample, wherein said scanning charged-particle microscope is characterized in that a passage aperture for limiting the passage of the charged-particle optical beam is located between the charged-particle source and said scanning deflector, and in that a member for limiting the passage of the charged-particle optical beam is provided at least in the center of said passage aperture.

DETAILED DESCRIPTION OF THE PREFERRED EMBODIMENTS

[Detailed Description of the Preferred Embodiments]

The apparatus according to the present invention is intended to realize both the improvement of both electron beam spatial resolution and focal depth at the same time in the scanning electron microscope (SEM), one type of scanning charged-particle microscope. How the apparatus according to the present invention works is described below. Although the description below relates to SEM, the description can also be applied to an apparatus by which a positron beam having inverse positive polarity at the same weight as that of an electron is scanned on a sample.

Focal depth, as explained in expression (1), is represented as $D_F=d_p/\alpha$, whereas the beam diameter, $d_p$, is approximately represented by the following expression as the square root of the sum of squares between the Gaussian image size, $d_g$, determined by the electron optical system, and the respective indistinctness levels ($d_d$, $d_c$, $d_s$) of the beam due to diffractive aberration, chromatic aberration, and spherical aberration:

$$d_p^2 = d_g^2 + d_d^2 + d_c^2 + d_s^2 \quad (2)$$

$$dg = Mo \cdot \rho \quad (3)$$

$$d_d = 0.6\lambda/\alpha \quad (4)$$

$$d_c = Cc \cdot (\Delta E/E)\alpha \quad (5)$$

$$d_s = (1/2) Cs \cdot \alpha^3 \quad (6)$$

where Mo is the magnification of the electron optical system, $\rho$ is the size of the virtual light source of the electron gun, $\lambda$ is the wavelength of the electron radiated, Cc and Cs are a chromatic aberration coefficient and a spherical aberration coefficient, respectively, E is an electron radiation energy level, and $\Delta E$ is the fluctuation spread of the electron radiation energy. A typical $\alpha$-dependency curve of $d_p$ is shown as FIG. 4.

Figure 4:
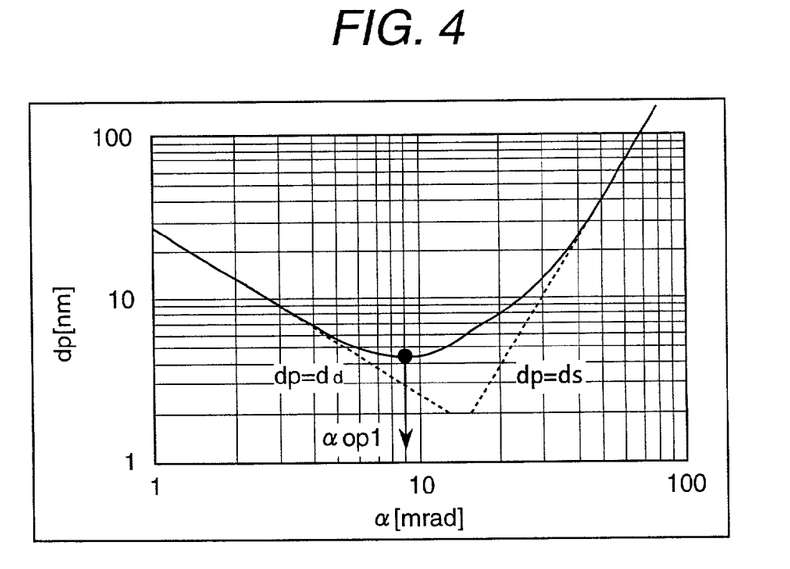
FIG. 4 is a typical curve showing the $\alpha$-dependency of $d_p$.

The curve of $d_p$ has its minimum value in a region of $\alpha = \alpha_{opt}$, and in this case, the maximum image resolution (spatial resolution) can be obtained. In a region of $\alpha << \alpha_{opt}$, there is the relationship that $d_p = d_d$, whereas in a region of $\alpha >> \alpha_{opt}$, there is the relationship that $d_p = d_s$.

For example, when a semiconductor device high in the degree of integration is to be observed using an electron beam determined under such conditions as set forth above, since there is a contradictory relationship between the beam diameter, $d_p$, and focal depth, $D_F$, reduction in the beam diameter under fixed "$\alpha$" conditions for the purpose of observing the microstructured semiconductor device results in the insufficiency of focal depth. In other words, even when focus is placed on the surface of a semiconductor device high in the degree of integration, the focus may shift at a section significantly different in level with respect to the corresponding surface, such as the bottom of a contact hole.

Also, although it seems possible, from expression (1), to increase $D_F$ by reducing $\alpha$ from $\alpha_{opt}$, since the relationship of $d_d \propto 1/\alpha$ exists as can be seen from expression (4), $d_d$ increases and image resolution deteriorates.

The apparatus according to the present invention enables both the spatial resolution of an electron beam to be improved and its focal depth to be enlarged, and relates to a scanning electron microscope by which, during SEM observation of a semiconductor device particularly high in the degree of integration and significantly different in level, clear and sharp images of the sample can be obtained over the entire observation region (electron beam scanning region).

In this embodiment, in order to fulfill such an object, a plate-like annular aperture body with an aperture annularly formed therein (an aperture in the center of which is provided a member that limits the passage of the electron beam) is located between the electron source and scanning deflector of SEM to ensure that the electron beam that has passed through the aperture is focused in probe form and that the electron probe is two-dimensionally scanned using the above-mentioned scanning deflector.

Art relating to an electron beam apparatus equipped with an annular aperture plate is disclosed in, for example, Japanese Application Patent Laid-Open Publication Nos. Hei11-297610, 12454 (2000), and Sho48-85069. The art disclosed in the literature is intended to radiate an electron beam to a sample or mask and project the transmitted electron beam onto a phosphor plate or the sample. That is to say, the art is not such that the electron beam that has been passed through the annular aperture plate described below is focused into probe form by objective lenses with the view of scanning the corresponding electron probe on the sample.

Unlike the electron beam aligner or transmission-type electron microscope projecting an electron beam onto a sample or mask, in SEM that scans an electron beam, since its beam diameter determines the resolution for a high magnification, the beam diameter must be reduced to achieve high resolution. At the same time, however, to maintain high resolution always on the nonuniform surfaces of samples, it is necessary not only to reduce the beam diameter, but also to increase focal depth under the reduced status of the beam diameter.

However, as described earlier in this SPECIFICATION, there is a contradictory relationship between the beam diameter and focal depth, and it has thus been difficult to increase focal depth while at the same time reducing the beam diameter. With the apparatus according to the present invention, images of samples such as semiconductor devices high in the degree of three-dimensional integration can be observed at high resolution levels by satisfying the originally contradictory conditions mentioned above. The principles of the apparatus according to the invention are described below using drawings.

Figure 1:
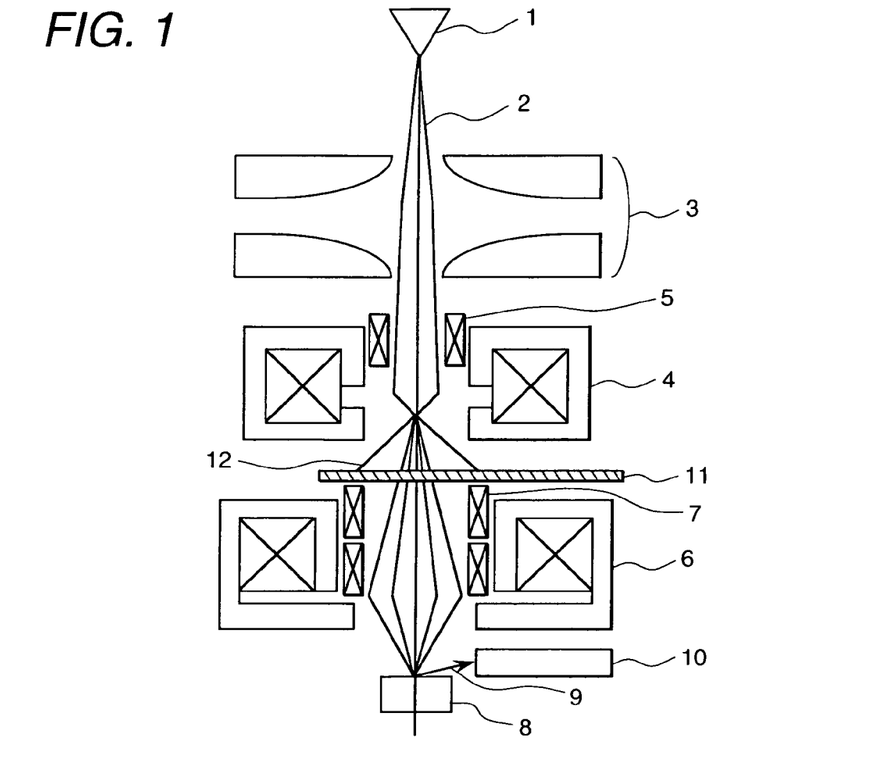
FIG. 1 is a schematic block diagram of a scanning electron microscope which employs an aperture body equipped with the annular aperture pertaining to the present invention.
Figure 2:
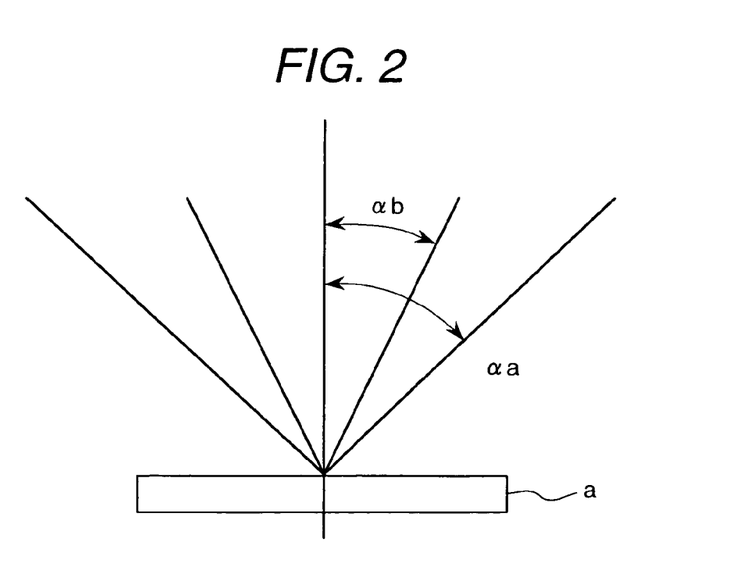
FIG. 2 is a view explaining in geometrically optical form the samples irradiation beam (annular shape) pertaining to the present invention.
Figure 3:
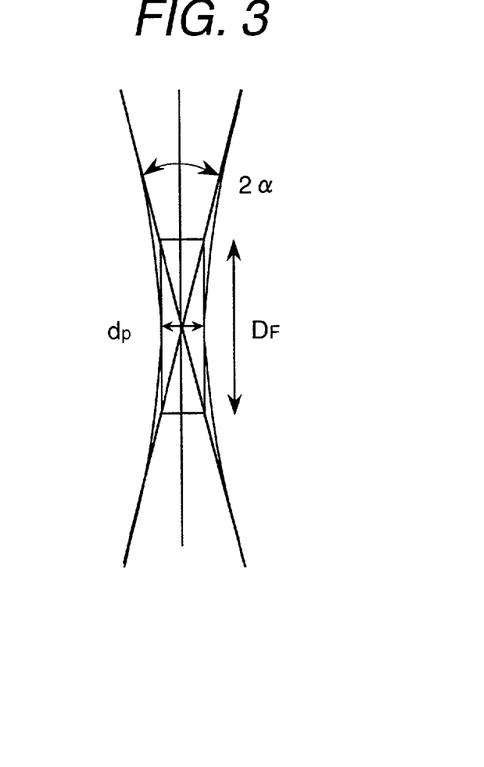
FIG. 3 is a view explaining the relationship between the half-opening angle, $\alpha$, of the beam on a sample, the beam diameter, $d_p$, and the focal depth, $D_F$, of the beam on the sample.

A schematic view of SEM equipped with a plate-like annular aperture body is shown as FIG. 1. After an electron beam 2 has been taken out from an electron gun 1 and accelerated using an acceleration lens 3, is focused on a sample 8 by a focusing lens 4 and an objective lens 6. The focused beam is then scanned on the sample by a deflector 7, and the secondary electron 9 emitted from the sample is detected by a secondary-electron detector 10. An aperture body 11 for limiting the focused beam is located between deflector 7 and electron gun 1. Aperture body 11 has an annular aperture 12 as one of the apertures for limiting the passage of the electron beam, and the half-opening angle, $\alpha$, of the electron beam focused on the sample stays within the band of specific values $\alpha_a$ and $\alpha_b$ ($<\alpha_a$) as shown in geometrically optical form in FIG. 2, wherein the passage of the electron is limited in the half-opening angle range from 0 degrees (optical axis) to $\alpha_b$.

Figure 5:
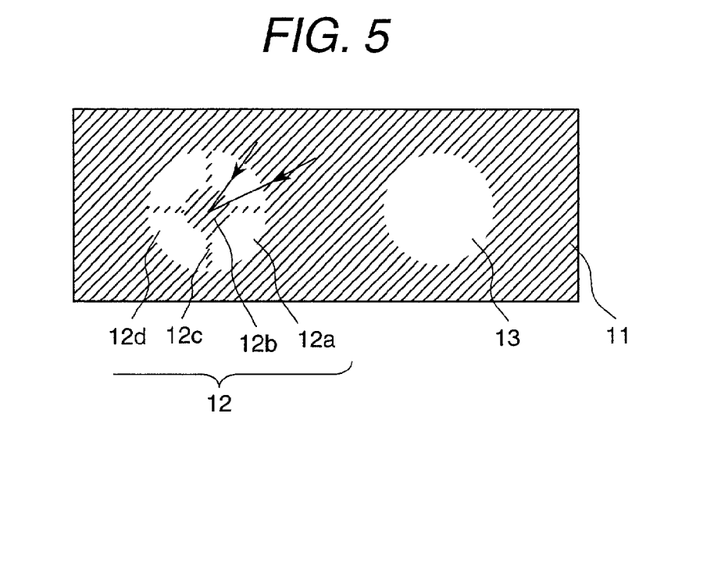
FIG. 5 shows an embodiment of an aperture body having the annular aperture and circular aperture pertaining to the present invention.

If the parameter, $\beta$, that denotes the annulation level is defined as $\beta = \alpha_b/\alpha_a$, the aperture of $\beta=0$ is equivalent to a circular aperture. Aperture body 11 with annular aperture 12 and circular aperture 13 is shown in FIG. 5. The corresponding aperture body has the shape of a plate and is formed of tantalum (Ta) and molybdenum (Mo) materials. Also, the aperture can have a heating means for cleaning dirt away therefrom. The shielding plate 12b inside annular aperture 12 is concentric with aperture outer surface 12a and fixed to aperture outer surface 12b via beams 12c and 12d. If the radii of the outer and inner circles of annular aperture 12 are taken as $r_a$ and $r_b$, respectively, there is the relationship of $\beta = r_b/r_a$.

Figure 6A:
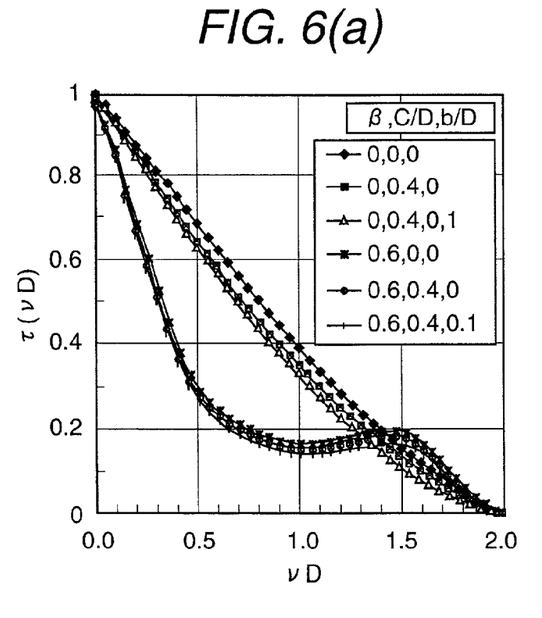
FIG. 6 shows an example of comparison between the calculation curves for the transfer function (response function), $\tau(\upsilon D)$, of an SEM optical system having annulation levels of $\beta=0$ and $\beta=0.6$.
Figure 6B:
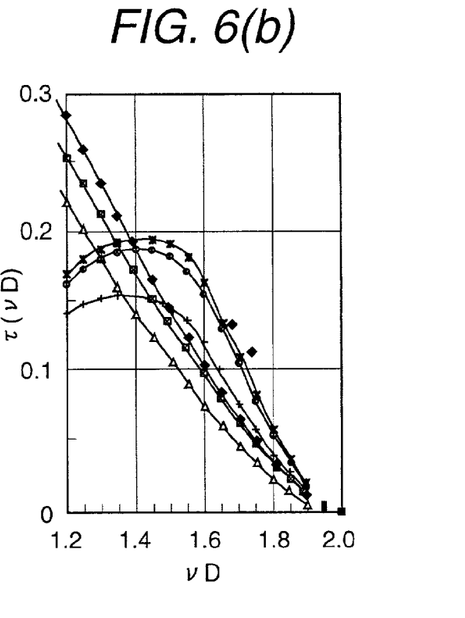

A comparative example of the calculation curve for the transfer function (also called the response function), $\tau(\nu D)$, that is used as a criterion for evaluating the SEM optical systems whose β values are 0 and 0.6, is shown in FIG. 6 to check the annulation effect of the aperture body. In this figure, τ(υD) plotted along the vertical axis denotes changes in image contrast level. Likewise, "υ" in υD plotted along the horizontal axis denotes changes in wave number (spatial frequency), "D" denotes λ/α, and υD is a parameterized, dimensionless representation of "υ". Also, "α" in λ/α denotes $α_a$. FIG. 6(b) is an enlarged diagram of the υD data region from 1.2 to 2.0 in FIG. 6(a). Parameters B, C, and D in calculation parameters B/D, C/D, and b/D, denote spherical aberration, chromatic aberration, and the size of the electron gun virtual light source, respectively, and these parameters are defined using the following expressions:

$$B = (1/4) Cs \cdot α_a^3 \quad (4)$$

$$C = (1/2) Cc(ΔE/E) α_a \quad (5)$$

$$b = ρ/2 \quad (6)$$

Typical calculation results obtained in the case that (C/D, b/D) takes values of (0, 0), (0.4, 0), and (0.4, 0.1) with respect to B/D=0, β=0, and β=0.6, are shown in FIG. 6. The case that B/D=0 and (C/D, b/D)=(0, 0), in particular, corresponds to the stigmatic optical system of the point light source. In the τ(υD) curve, the reciprocal of the υ value (=$υ_{0.1}$) which satisfies the condition of τ(υD)=0.1 is defined as the image resolution, $R_{0.1}$, and this reciprocal is used as a shortcut evaluation parameter. The $D/R_{0.1}(=υ_{0.1}D)$ values in the range from B=0 to B=0.6 are listed in TABLE 1. When β=0 to 0.6, the image resolution, $R_{0.1}$, can be improved by about 6 to 7 percent. Furthermore, even when spherical aberration exists (B is not equal to 0), provided that B/D≦1, the effects of the spherical aberration are not significant and $R_{0.1}$ can be improved at much the same ratio as that shown above.

Figure 7:
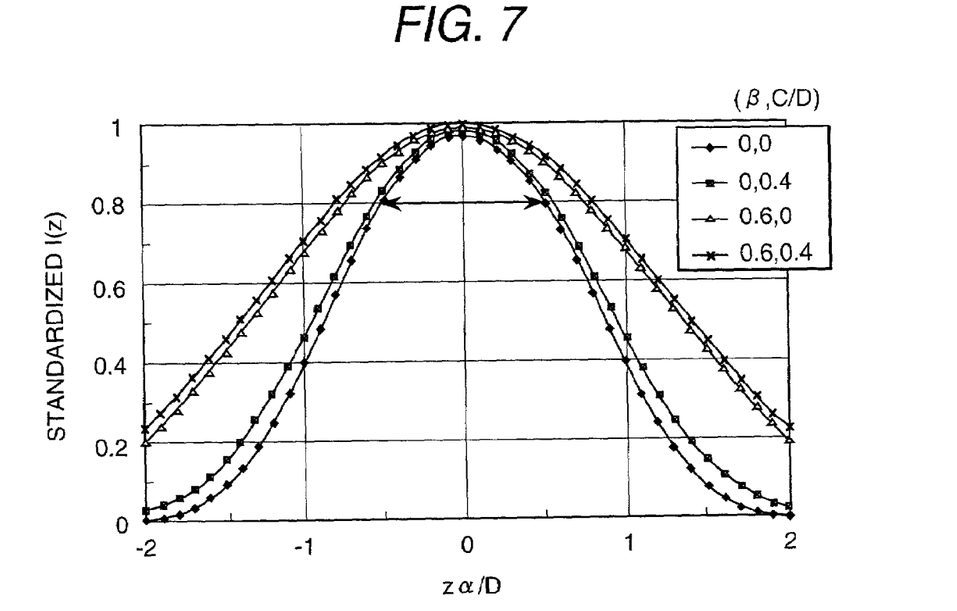
FIG. 7 is a standardized beam intensity distribution, i(z), on the optical path (z-axis).

Next, calculation results on focal depth, Δz, are shown below. The standardized beam intensity distribution, i(z), on the optical path (z-axis) is shown in FIG. 7. As in FIG. 6, calculations were conducted under the conditions of (C/D, b/D)=(0, 0) and (0.4, 0) with respect to β=0 and β=0.6. Focal depth, Δz, can be approximated in the z-region satisfying i(z)≧0.8, and the Δzα/D values are also listed in TABLE 1. It can be seen from this table that Δz can be significantly improved by about 50 to 60 percent in the β range from 0 to 0.6. These improvement effects relating to image resolution and focal depth have also been ascertained experimentally.

TABLE 1

| (C/D, b/D) | β = 0 | | β = 0.6 | | Improvement ratio [%] | |
|---|---|---|---|---|---|---|
|  | D/R0.1 | Δzα/D | D/R0.1 | Δzα/D | D/R0.1 | Δzα/D |
| (0, 0) | 1.61 | 1.03 | 1.71 | 1.61 | 6 | 56 |
| (0.4, 0) | 1.60 | 1.10 | 1.71 | 1.66 | 6 | 51 |
| (0.4, 0.1) | 1.53 | — | 1.65 | — | 7 | — |

Although the electron gun used in the embodiment set forth above is of the Schottky, a heating type (tungsten [W] hairpin) or an electric field emission type is likewise available as an electron gun suitable for an electron microscope (the electric field emission type is further divided into two subtypes:cold and hot). The characteristics of these electron guns (namely, luminance, the size, ρ, of a virtual light source, an energy spread, ΔE, and a beam current noise level) are shown in TABLE 2. In terms of the improvement effects that can be obtained by use of the annulation described above, electron guns small in ρ and ΔE, namely, the electric field emission type and Schottky type of electron guns are particularly excellent and this has also been confirmed experimentally.

TABLE 2

| | Heating type | Electric field emission type | | Shottky type |
|---|---|---|---|---|
| | (W hairpin) | Cold | Hot | |
| Luminance | $10^3$ | $10^3$ | $5 × 10^3$ | $5 × 10^3$ |
| ρ | 20–50 μm | 3 nm | 30 nm | 15 nm |
| ΔE [eV] | 1–2 | 0.2–0.3 | 0.8–1.8 | 0.3–0.7 |
| Beam current noise [% RMS] | <0.5 | 4–6 | 5–10 | <1 |

The τ(υD) curves in FIG. 6 are described in further detail below. The τ values of high-frequency components near the diffraction limit (υD=1.6) of the circular aperture (β=0) are increased by annulation, and as a result, image resolution, $R_{0.1}$, is improved. At the same time, however, since the τ values of low-frequency components, except in the neighborhood of υD=0, decrease, these low-frequency components deteriorate in contrast level. Although focal depth increases as β becomes closer to 1, since contrast deteriorates more significantly, a contradictory relationship exists between focal depth and contrast. The transmission ratio of electron wave intensity against an annular aperture whose annulation level is P can be expressed as $(1−β^2)$ from the aperture area ratio, and to obtain the same transmitted electron wave intensity as that achievable in the case of a circular aperture whose β is 1, the intensity of the electron wave radiated through the annular aperture must be increased to $1/(1−β^2)$ times. This increases contrast by $1/(1−β^2)$ times with respect to all frequency components, thus leading to the improvement of image quality. This improvement effect has also been experimentally confirmed.

Although electron microscopes are evaluated in terms of characteristics such as image resolution, image quality, and focal depth, the weight attached to each characteristic differs according to the particular observation requirements. To meet various observation requirements, it is desirable that an aperture body having both a circular aperture and an annular aperture should be adopted. A movement feature not shown in the present embodiment is provided so that the above apertures are positioned on the passage route of the electron beam. In the apparatus according to the present embodiment, aperture body 11 having a circular aperture 13 adjacent to the annular aperture 12 shown in FIG. 5 is formed to enable the selection of either according to the particular observation requirements. The selection of annular aperture 12 or circular aperture 13 is performed in the following sequence:

First, (1) the position of the aperture body is adjusted beforehand within a plane parallel to the aperture body surface so that the centers of annular aperture 12 and circular aperture 13 almost align with the optical axis. Next, (2) the beam position correction data and scan image rotational correction data to be applied to the deflector in order to perform corrections for both the shift in position of the beam focused on the sample, and for any scan image rotational errors on the sample, between both apertures, are registered along with the above-mentioned amounts of position adjustment. During actual observation, (3) the appropriate data is retrieved from registered data so as to enable either aperture to be selected according to the particular requirements, and position setting of the apertures in the aperture body, the correction of the beam position, and the correction of scan image rotational errors are conducted.

Since the rate at which the electron beam passes through an annular aperture is smaller than that of a circular aperture, it is advisable to use circular apertures when priority is to be assigned to, for example, image contrast and brightness, or to use annular apertures when priority is to be assigned to image resolution during the imaging of samples. Also, since image observation at higher magnifications, in particular, requires higher image resolution, an easier-to-use scanning electron microscope can be supplied by providing the apparatus with such a sequence that enables automatic selection of a circular aperture or an annular aperture in synchronization with the selection of a low-magnification mode or a high-magnification mode.

In addition, for an apparatus having the ability to conduct multi-point observation on a semiconductor wafer, automatic multi-point observation based on the appropriate beam conditions can be implemented by adopting the configuration that permits the creation of a recipe which sets the annular aperture or the circular aperture, depending on the particular situation of the observation point.

The apparatus according to the present embodiment has a control unit and a display unit, and the control unit is further equipped with a storage medium which can contain the data required for such aperture selection as mentioned above, and for automatic selection of another optical apparatus, with the two selection functions being performed in accordance with the data stored within the corresponding storage medium.

Figure 8:
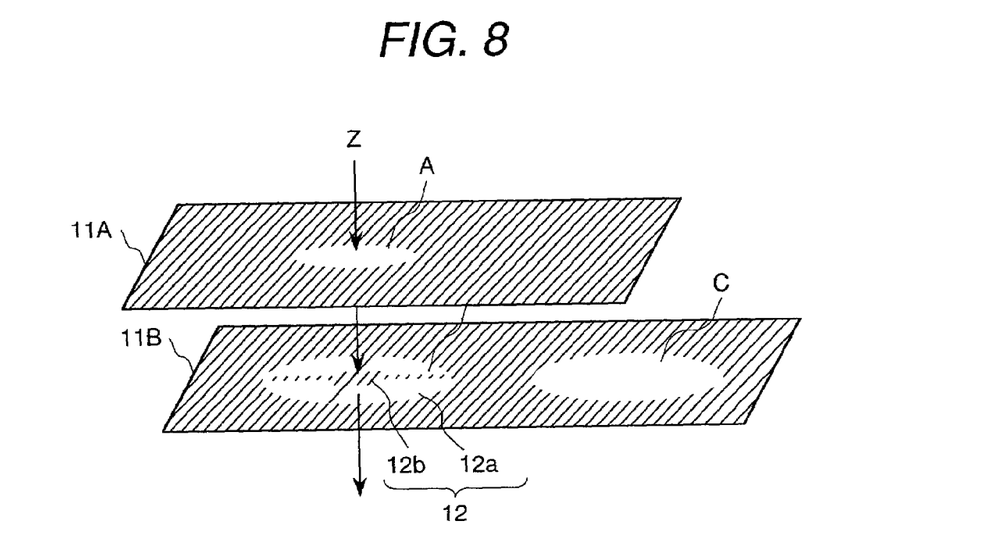
FIG. 8 shows an embodiment in which an annular aperture is formed using a circular aperture body 11A equipped with a circular aperture, and a shielding disc/large circular aperture body 11B equipped with a shielding disc 12b.
Figure 9:
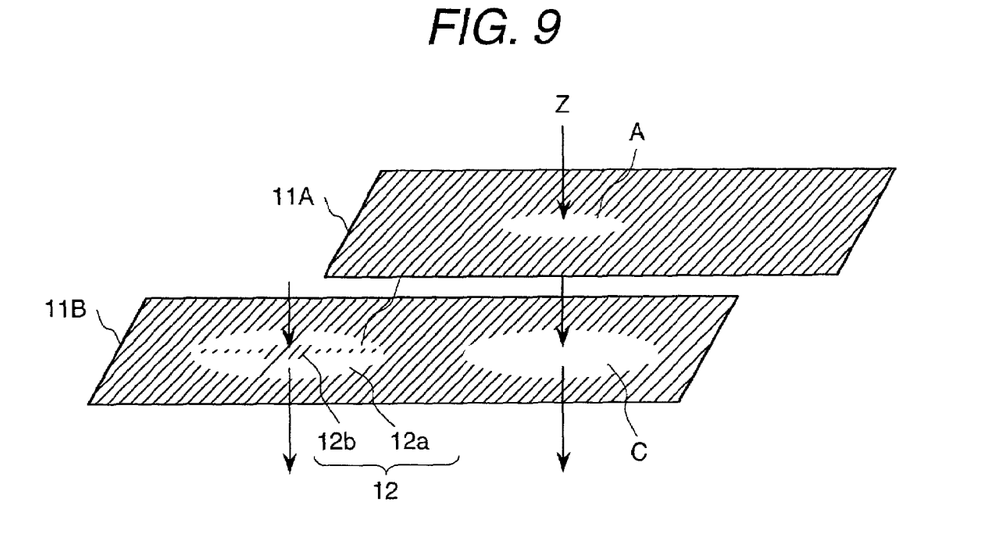
FIG. 9 shows an embodiment in which circular apertures are formed using a circular aperture body 11A equipped with a circular aperture, and a shielding disc/large circular aperture body 11B equipped with a large circular aperture C.

Aperture body 11 in the embodiment described above is of a single-piece configuration. An embodiment using an aperture body of a two-piece configuration is described below using FIGS. 8 and 9. Aperture body 11 in this embodiment consists of two pieces: a circular aperture body 11A (a first plate-like body), which is located at the electron source side and has a circular aperture A, and a shielding disc/large-size circular aperture body 11B (a second plate-like body), which is located at the sample side and has a shielding disc 12b and a large circular aperture C adjacent thereto. Both aperture bodies are further provided with a movement feature that enables the corresponding aperture body to be independently moved along a plane parallel to that of the other aperture body, that is to say, a plane vertical to the optical axis, and thus the corresponding disc and aperture to be positioned on the orbit of the electron beam. FIGS. 8 and 9 show embodiments in which the circular aperture body 11A and the shielding disc/large-size circular aperture body 11B are combined to form an annular aperture and a circular aperture, respectively. An annular aperture body can be effectively created by moving it so that the centers of its circular aperture A and shielding disc/large-size circular aperture B overlap on the optical axis of objective lens 6. Similarly, a circular aperture equivalent to the above-mentioned circular aperture A can be essentially created by moving the corresponding aperture body so that the centers of its circular aperture A and shielding disc/large-size circular aperture C overlap on the optical axis of objective lens 6.

The creation of the annular aperture body consists of three steps: step 1, in which the center of circular aperture A is located on the optical axis of the objective lens; step 2, in which two-dimensional scanning of electron beam 2 by use of an aligner 5 is conducted on the circular aperture A of circular aperture body 11A (see FIG. 1), then either the rate of passage of the secondary electron emitted from sample 8, or the amount of current absorbed by circular aperture body 11A, at that time, is converted into a luminance signal, and scan-image G is created from this signal, and; step 3, in which, while the image of circular aperture A in scan-image G is being monitored, shielding disc 12b is located in the center of that image.

Although the focusing point for the electron beam 2 scanned on circular aperture A in step 2 does not always need to be matched to the z-position of circular aperture A, it is desirable that the focusing point be matched to the z-position, because a sharper image of circular aperture A can be obtained in step 3 and because axial matching accuracy between circular aperture A and shielding disc 12b improves.

If the distance between circular aperture body 11A and shielding disc/large circular aperture body 11B is short enough and changes in beam diameter, associated with the divergence or focusing of the beam between both aperture bodies can be ignored, the size (radius) ratio between circular aperture A, shielding disc 12b, and large circular aperture C, that is to be used for calculating the annulation level, $\beta$, does not need to be adjusted. For example, for the formation of an annular aperture, if the radii of circular aperture A and shielding disc 12b are taken as $r_a$ and $r_b$, respectively, the annulation level, $\beta$, is equal to $r_b/r_a$. However, the radius, $r_{11a}$, of the aperture outer surface which forms shielding disc 12b is sufficiently great in comparison to $r_a$.

Figure 10:
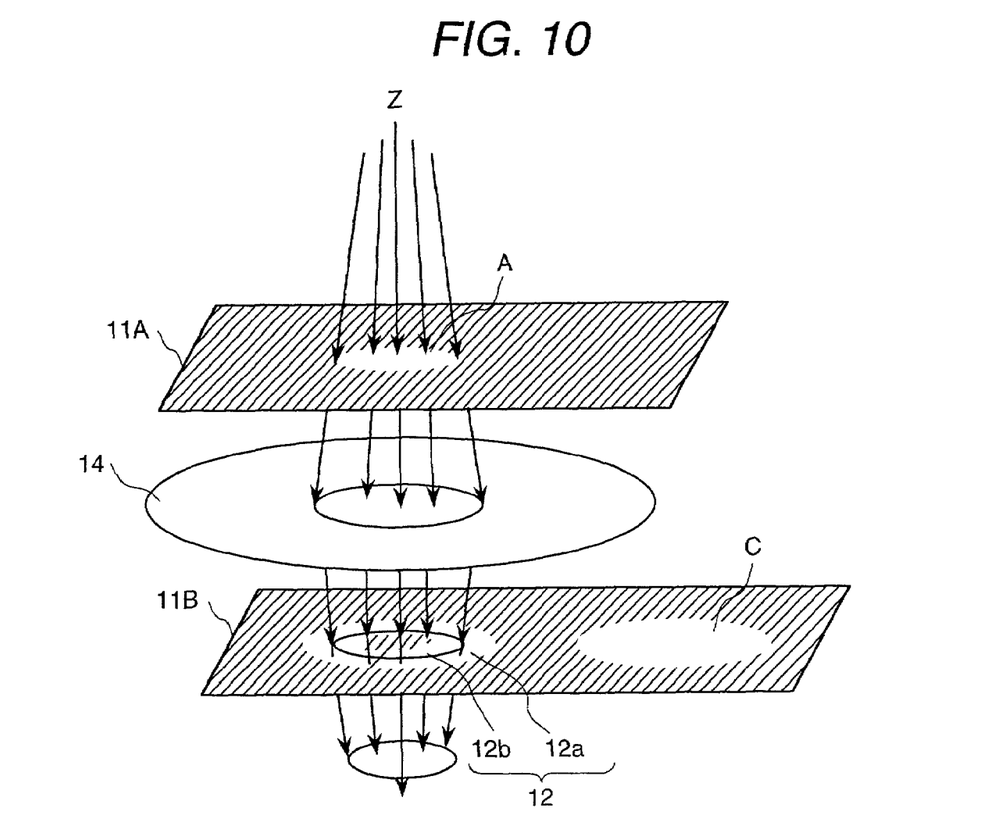
FIG. 10 shows an embodiment in which an annular aperture is formed with a lens inserted between a circular aperture body 11A and a shielding disc/large circular aperture body 11B equipped with a shielding disc 12b.

Next, an embodiment using the aperture body 11 which requires the adjustment of the size (radius) of its aperture during the calculation of the annulation level, $\beta$, is shown in FIG. 10. Although this aperture body 11, as with those of FIGS. 8 and 9, is a two-piece body consisting of circular aperture body 11A and shielding disc/large circular aperture body 11B, lens 4 exists between both aperture bodies. For the formation of an annular aperture, if the beam whose passage is limited by circular aperture A has a diameter of $r_{a,11B}$ at the z-position of shielding disc/large circular aperture body 11B and the radius of shielding disc 12b is taken as $r_b$, the annulation level, $\beta$, can be represented using the expression shown below. The radius, $r_{12a}$, of the aperture outer surface 12a which retains shielding disc 12b is sufficiently great in comparison to $r_{a,11B}$.

$$\beta = r_b/r_{a,11B} = K r_b/r_a$$

where K, a size correction coefficient, is equal to $r_a/r_{a,11B}$ and does not always become 1.

Although, in the configurations of aperture bodies 11 in FIGS. 8 to 10, circular aperture body 11A with circular aperture A is located at the electron source side and shielding disc/large circular aperture body 11B with both shielding disc 12b and large circular aperture C adjacent thereto is located at the sample side, similar effects can be obtained, even if the arrangement of these aperture bodies is opposite.

FIG. 1 shows an example of SEM in which secondary electron 9 emitted from the surface of the sample during electron beam irradiation is used to create luminance signal information on an electron microscope image. If the electron acceleration voltage is increased above about 100 kV and the thickness of the sample is reduced to the range from several tens to several hundred nanometers, the electron beam that has transmitted the corresponding sample can also be used. A microscope image based on a secondary electron provides surface information relating mainly to the sample, whereas a microscope image based on a transmitted electron beam provides internal information on the sample.

Figure 11:
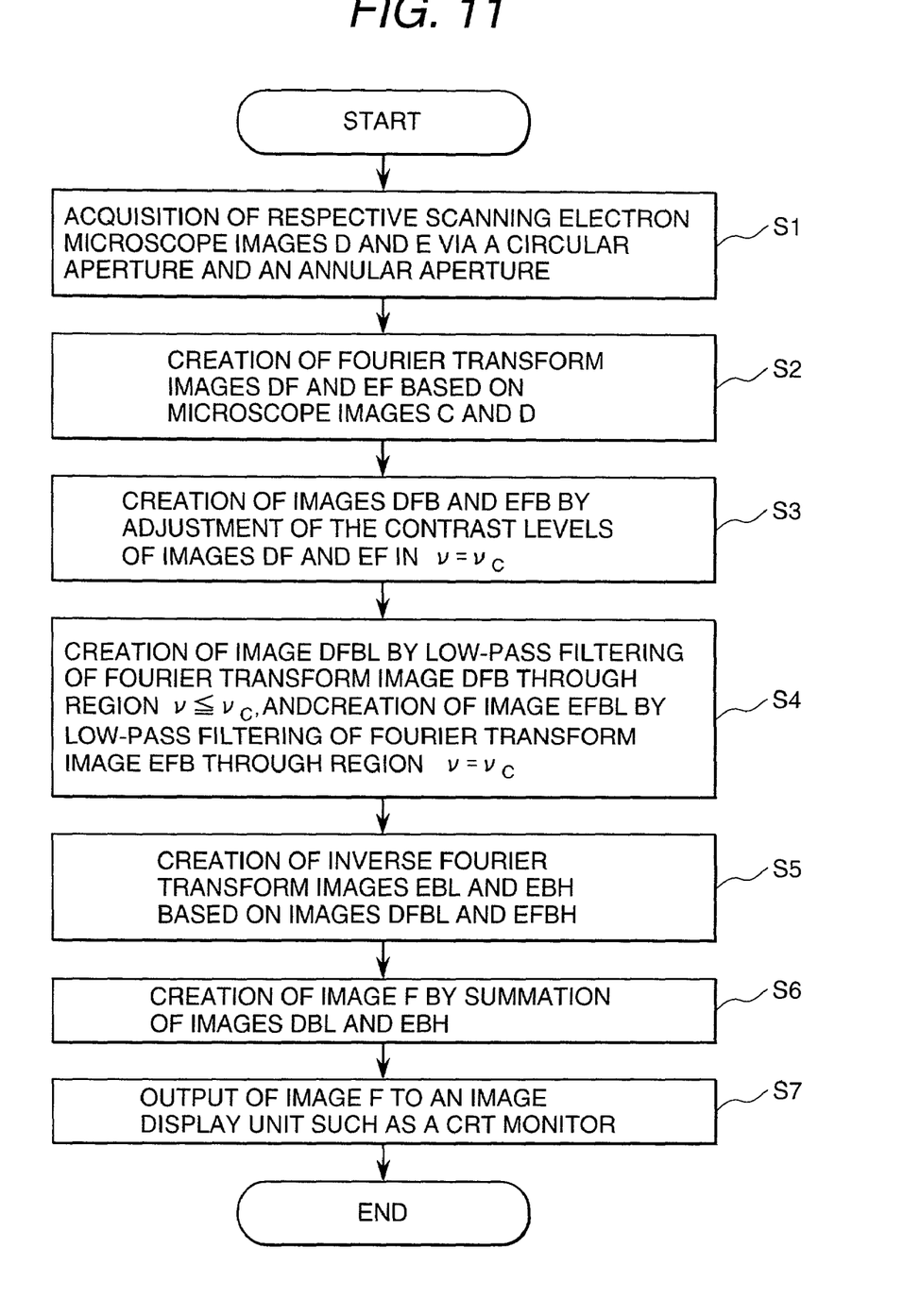
FIG. 11 is a diagram showing the processing flow of the image-processing unit pertaining to the present invention.
Figure 12:
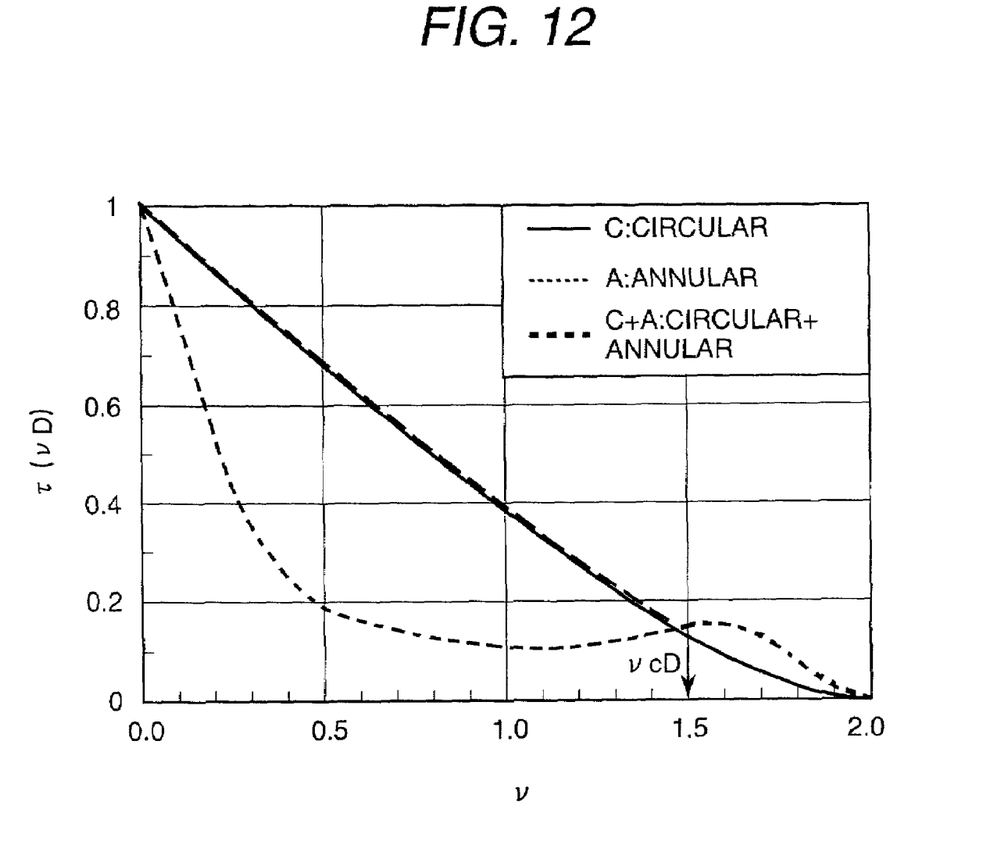
FIG. 12 shows three types of $\tau(\upsilon D)$ curves for comparison purposes, namely, $\tau_c(\upsilon D)$ and $\tau_A(\upsilon D)$ curves of the electron microscope images obtained when a circular aperture and an annular aperture were used, and a $\tau_{c+A}(\upsilon D)$ curve of a virtual electron microscope image using a combination of the circular aperture and annular aperture formed during the processing flow of the image-processing unit.

Also, although the apparatus according to this embodiment uses a secondary electron to create an image of a sample, the embodiment is not limited to such an application and can likewise be applied to an apparatus which uses a reflected electron to create an image of a sample. Next, an embodiment of an imaging method which uses an electron microscope characterized in that the electron microscope images D and E obtained when the above-described apertures according to the present invention are a circular aperture and an annular aperture can be photographed and then after a new microscope image F has been created from both images, this new image can be displayed, is described using FIGS. 11 and 12. The aperture body in this embodiment is the aperture body 11 shown in FIG. 5, 7, or 9, and the annulation level of its annular aperture is set as $\beta=\frac{1}{2}^{1/2}=0.71$. The flow of processing in which both images are to be used to create and display a new microscope image F is shown as FIG. 11. First, in S1, the electron microscope images D and E obtained via a circular aperture and an annular aperture are photographed and then recorded as digital information. In S1, however, the intensity (more exactly, the irradiation angle current density) of the electron beam radiated from the electron gun is doubled to ensure that the electron microscope image E at the annular aperture is photographed with twice the intensity of the beam after it has passed through the aperture. Next, in S2, Fourier transform images based on microscope images D and E are created as $D_F$ and $E_F$, respectively. In S3, images $D_{FB}$ and $E_{FB}$ by adjustment of the contrast levels, $\tau(\upsilon D)$ of images $D_F$ and $E_F$ in the $\upsilon=\upsilon_c$ region are created, wherein, as shown in FIG. 12, $\upsilon_c$ is a cutoff frequency value determined by the electron beam energy on the sample, the aberration coefficient of the optical system, and the half-opening angle, $\alpha$, of the beam. In S4, image $D_{FBL}$ by low-pass filtering of Fourier transform image $D_{FB}$ through the $\upsilon \leq \upsilon_c$ region at a spatial frequency, $\upsilon$, is created, whereas image $E_{FBL}$ by low-pass filtering of Fourier transform image $E_{FB}$ through the $\upsilon \geq \upsilon_c$ is created. In S5, the inverse Fourier transform images corresponding to Fourier transform images $D_{FBL}$ and $E_{FBH}$, namely, real spatial images $D_{BL}$ and $E_{BH}$ are created. Finally, in S6, a summation-based image F by adjustment of the positions of real spatial images $D_{BL}$ and $E_{BH}$ is created, and in S7, the summation-based image F is sent to an image display unit such as a CRT monitor.

The summation-based image F has the features that this image, is one to two times improved over image C in terms of the contrast level of the high-frequency components in the $\upsilon \geq \upsilon_c$ region and that focal depth is improved by several tens of percent. In addition, image resolution is improved by several percent. These improvement effects are described below from the viewpoint of the response function, $\tau(\upsilon D)$. Three types of curves . . . namely, $\tau_c(\upsilon D)$ and $\tau_A(\upsilon D)$ curves of the electron microscope images obtained when a circular aperture and an annular aperture were used, and $\tau_{c+A}(\upsilon D)$ curve of the electron microscope image corresponding to the summation-based image F created by low-pass filtering and high-pass filtering, are shown in FIG. 12 for comparison. In the $\upsilon \leq \upsilon_c$ region, $\tau_{c+A}(\upsilon D)$ agrees with $\tau_c(\upsilon D)$, whereas in the $\upsilon \geq \upsilon_c$ region, $\tau_{c+A}(\upsilon D)$ agrees with $\tau_{c+A}(\upsilon D)$. Since, in the latter region, the value of $\tau_{c+A}(\upsilon D)/\tau_c(\upsilon D)$ is from 1 to 2, it can be seen that the contrast levels in this region are improved by one to two times over those of the image obtained using the circular aperture.

An example of an apparatus using a pupil of an annular shape in an imaging optical system is disclosed in Chapter 2 of "Optics of Ultrahigh-Image Resolution", compiled by Satoshi Kawada and published in 1999 by the GAKKAI Publishing Center.

According to the present invention heretofore described, both the focal depth and resolution of a charged-particle microscope which scans the surface of a sample can be improved at the same time.

What is claimed is:

1. A scanning charged-particle microscope having
    a charged-particle source,
    a lens for focusing a charged-particle beam emitted from said charged-particle source, and
    a scanning deflector for scanning said charged-particle beam in two-dimensional form on a sample,
    wherein said scanning charged-particle microscope includes a passage aperture for limiting the passage of the charged-particle beam is located between the charged-particle source and said scanning deflector, and a member for limiting the passage of the charged-particle beam is provided at least in the center of said passage aperture,
    said lens focusing the charged particle beam such that a plurality of differential parts of the charged particle beam passing through the passage aperture converges one point on the sample simultaneously,
    said scanning deflector scanning the converged charged particle beam, and
    an image of said sample is obtained by scanning said charged-particle beam having passed through said passage aperture on said sample using said scanning deflector.

2. A scanning charged-particle microscope as set forth in claim 1 above, wherein the scanning charged-particle microscope has the half-opening angle of said aperture for said charged-particle beam focused on a sample by said focusing lens has a band with respect to specific values of $\alpha_a$ and $\alpha_b$.

3. A scanning charged-particle microscope as set forth in claim 1 above, wherein the scanning charged-particle has said passage aperture is formed in a plate-like body, and in that said plate-like body is formed movably with respect to said charged-particle beam.

4. A scanning charged-particle microscope as set forth in claim 3 above, wherein the scanning charged-particle microscope has said plate-like body is provided with a circular aperture in addition to said passage aperture.

5. A scanning charged-particle microscope having a charged-particle source,
    a lens for focusing a charged-particle beam emitted from said charged-particle source on a sample with a half-opening angle which defines an irradiation angle of the charged particle beam against an optical axis of the charged particle beam,
    a scanning deflector for scanning said charged-particle beam in two-dimensional form on a sample,
    wherein said scanning charged-particle microscope includes a member located between the charged-particle source and said scanning deflector, the member having a limiting part which limits the charged particle beam having the half-opening angle being from zero degrees to $\alpha_b$ degrees and allows the charged-particle beam having the half opening angle being from $\alpha_b$ to $\alpha_a$ degrees ($\alpha_a > \alpha_b$) to pass the member
    said lens focusing the charged particle beam such that a plurality of differential parts of the charged particle beam having the half opening angle being from $\alpha_b$ degrees to $\alpha_a$ degrees converges one point on the sample, simultaneously, said scanning deflector scanning the converged charged particle beam, and an image of said sample is obtained by scanning said charged-particle beam which is cut off, the half opening angle being from $\alpha_b$ degrees to $\alpha_a$ degrees.

6. A scanning charged-particle microscope as set forth in claim 5 above, wherein the scanning charged-particle microscope has a plate-like aperture body in which an annular aperture is formed is provided between said charged-particle source and said scanning deflector.

7. A scanning charged-particle microscope as set forth in claim 6 above, wherein the scanning charged-particle microscope has in addition to said annular aperture, a circular aperture is provided in said plate-like aperture body, and in that there is provided a movement feature for positioning said annular aperture and said circular aperture on the orbit of said charged-particle beam.

* * * * *

UNITED STATES PATENT AND TRADEMARK OFFICE
CERTIFICATE OF CORRECTION

PATENT NO. : 7,186,975 B2  Page 1 of 1
APPLICATION NO. : 09/943262
DATED : March 6, 2007
INVENTOR(S) : Tohru Ishitani et al.

It is certified that error appears in the above-identified patent and that said Letters Patent is hereby corrected as shown below:

On the title page, item [57]:

<u>In the Abstract, line 1:</u>  Change "orer" to --order--.

| <u>Column</u> | <u>Line</u> | |
|---|---|---|
| 1 | 41 | Change "angle, a," to --angle, $\alpha$,--. |
| 4 | 39 | Before "is" insert --it--. |
| 9 | 60 | Change "agrees with $\tau_{C+A}$ ($\upsilon$D)" to --agrees with --$\tau_A$ ($\upsilon$D)--. |
| 10 | 38 | After "charged-particle" insert --microscope which--. |
| 10 | 39 | After "and" delete "in". |
| 10 | 40 | Delete "that". |
| 10 | 44 | After "body" insert --which--. |
| 10 | 66 | After "converges" insert --on--. |

Signed and Sealed this

Eighth Day of December, 2009

David J. Kappos
*Director of the United States Patent and Trademark Office*